(12) United States Patent
Liang et al.

(10) Patent No.: US 12,494,457 B2
(45) Date of Patent: Dec. 9, 2025

(54) LIGHT-EMITTING DIODE DISPLAY DEVICE AND METHOD OF MANUFACTURING THE SAME

(71) Applicant: Lextar Electronics Corporation, Hsinchu (TW)

(72) Inventors: Jian-Chin Liang, Hsinchu (TW); Chih-Hao Lin, Hsinchu (TW); Wei-Yuan Ma, Hsinchu (TW); Jo-Hsiang Chen, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 663 days.

(21) Appl. No.: 17/584,799

(22) Filed: Jan. 26, 2022

(65) Prior Publication Data
US 2023/0238362 A1    Jul. 27, 2023

(51) Int. Cl.
*H01L 25/075* (2006.01)
*H10H 20/01* (2025.01)
(Continued)

(52) U.S. Cl.
CPC ......... *H01L 25/0753* (2013.01); *H10H 20/01* (2025.01); *H10H 20/857* (2025.01); *H10H 29/352* (2025.01); *H10H 20/0364* (2025.01)

(58) Field of Classification Search
CPC ....... H01L 25/16; H01L 25/167; H01L 25/18; H01L 25/075; H01L 25/0753;
(Continued)

(56) References Cited

U.S. PATENT DOCUMENTS 10,089,908 B2   10/2018   Chen et al.
10,153,257 B2   12/2018   Cok et al.
(Continued)

FOREIGN PATENT DOCUMENTS

CN   110716345 A   1/2020
CN   111710705 A   9/2020
(Continued)

OTHER PUBLICATIONS

Chinese language office action dated Aug. 5, 2024, issued in application No. TW 112100198.

*Primary Examiner* — Amar Movva
(74) *Attorney, Agent, or Firm* — McClure, Qualey & Rodack, LLP (57) ABSTRACT

A light-emitting diode (LED) display device, including a substrate, a de-mura region, a plurality of mounting blocks, a first LED chip array and a second LED chip array, is disclosed. The substrate includes a first region and a second region adjacent to each other. The de-mura region includes part of the first region and part of the second region. The mounting blocks are arranged in the first and the second region as an array, each mounting block including a first and a second mounting part. The first and the second mounting part are connected in parallel. The first LED chip array includes multiple first LED chips. The second LED chip array includes multiple second LED chips. Each first mounting part is arranged on the first side of the corresponding mounting block, and each second mounting part is arranged on the second side of the corresponding mounting block.

18 Claims, 10 Drawing Sheets
(4 of 10 Drawing Sheet(s) Filed in Color)

(51) Int. Cl.
*H10H 20/857* (2025.01)
*H10H 29/30* (2025.01)

(58) Field of Classification Search
CPC ... H01L 27/153; H01L 27/156; H10H 29/352; H10H 29/32
See application file for complete search history.

(56) References Cited

U.S. PATENT DOCUMENTS

| | | | |
|---|---|---|---|
| 10,957,812 B2 | 3/2021 | An | |
| 11,054,695 B2 | 7/2021 | Oketani | |
| 11,482,590 B2 | 10/2022 | Lee | |
| 2013/0037838 A1* | 2/2013 | Speier | H01L 22/10 |
| | | | 118/620 |
| 2021/0126160 A1* | 4/2021 | Andrews | H10H 20/8316 |

FOREIGN PATENT DOCUMENTS

| | | |
|---|---|---|
| CN | 113410265 A | 9/2021 |
| CN | 113410279 A | 9/2021 |
| TW | 202115706 A | 4/2021 |

\* cited by examiner

LIGHT-EMITTING DIODE DISPLAY DEVICE AND METHOD OF MANUFACTURING THE SAME

BACKGROUND OF THE INVENTION

The present disclosure relates to a light-emitting diode display (LED) device, and, in particular, to a LED device with de-mura configurations.

Figure 1:
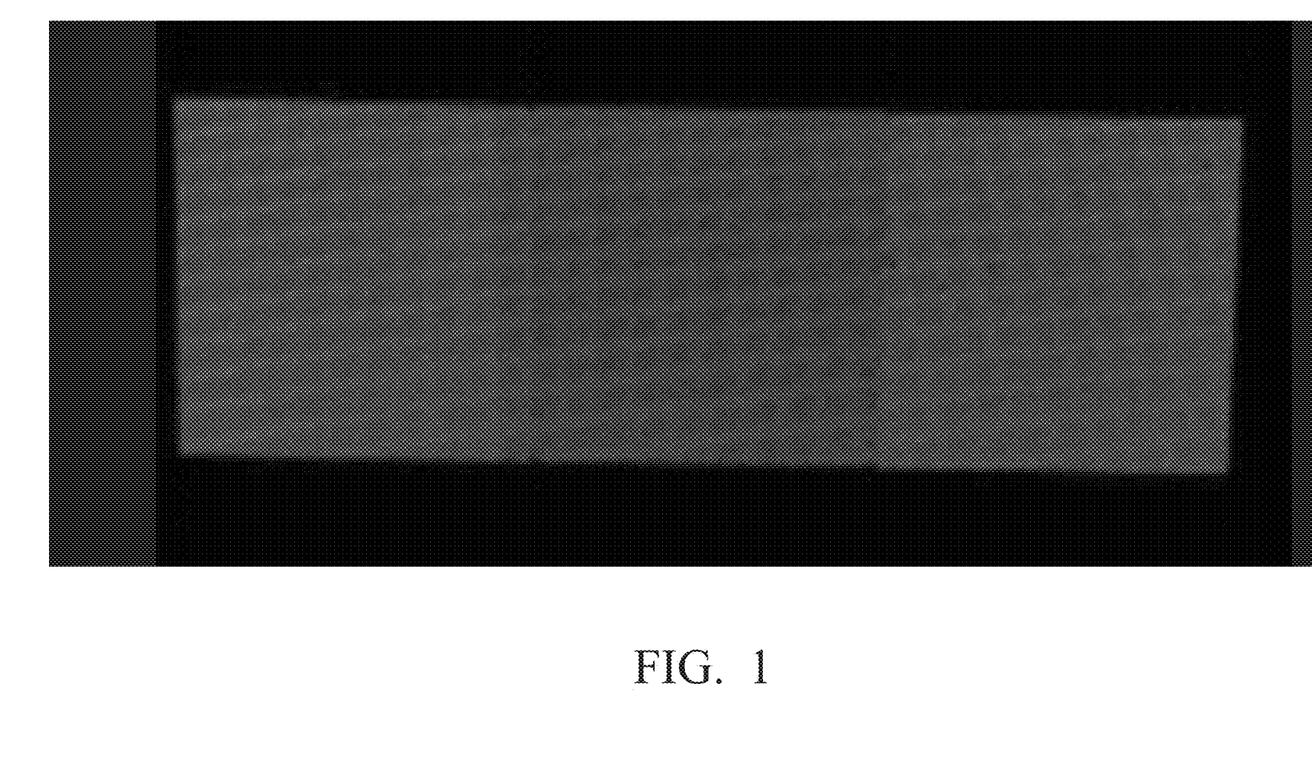
FIG. 1 shows the mura effect in a traditional LED display device.

Traditional light-emitting diode (LED) display devices suffer from the mura effect, which is the presence of unwanted mosaic patterns that appear on the screen. The uneven distribution of color (i.e. wavelength of light) and light intensity between adjacent pixels leads to visible color differences between these pixels, as shown in FIG. 1.

Traditional solutions to the mura effect include hardware and software improvements. For example, for public information display (PID) panels, the solution includes hardware methods such as shrinking the size of each LED chip's elements and distributing those LED chips randomly, in addition to software methods such as color calibration for each pixel.

However, the distance between pixels in PID panels are in the order of 1 mm while current display devices require a scale of LED chips in the order of 100 μm or less. In such a display device, millions of LED chips are required, and thus a mass transfer technique is required in the manufacturing process. Current mass transfer techniques include:

Step 1: grab a subarray of LED chips from the wafer with a stamp,

Step 2: transfer these LED chips onto the display panel, and

Step 3: repeat Steps 1 and 2.

Figure 2:
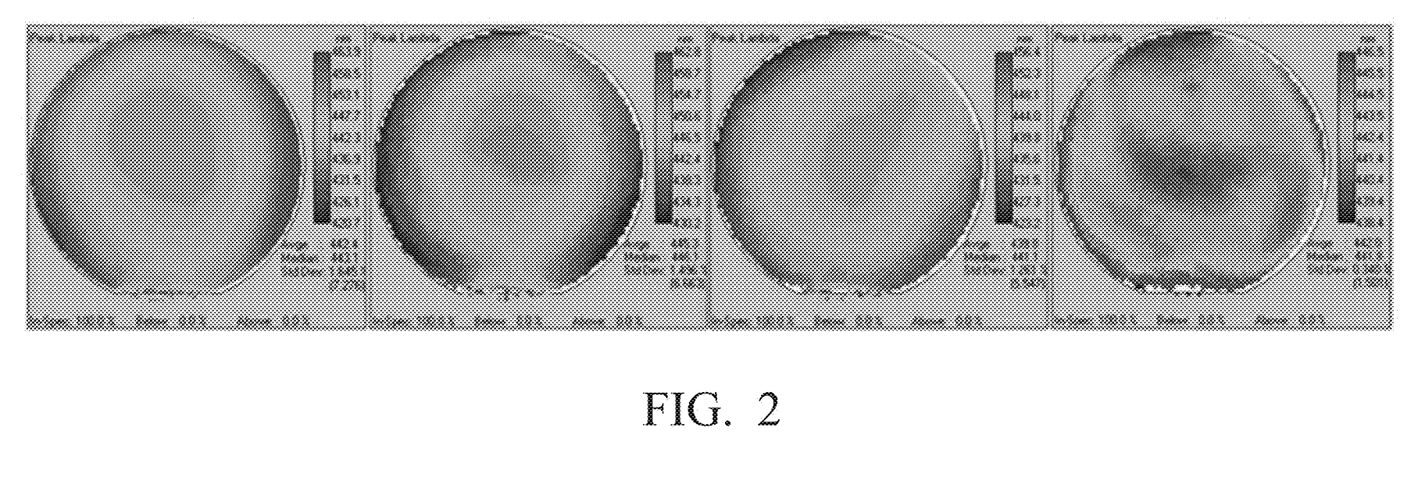
FIG. 2 shows an exemplary distribution patterns of the central wavelength of the emitting light of the LED chips in a wafer.
Figure 3:
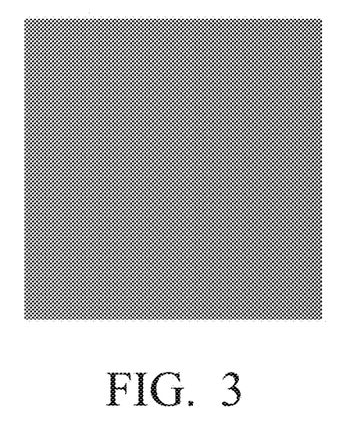
FIG. 3 shows the color differences occur between the LED chips within a single LED chip subarray.
Figure 4:
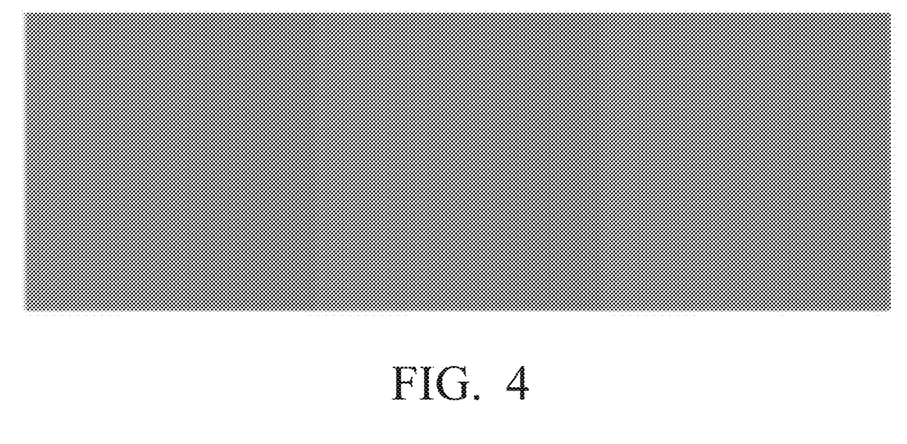
FIG. 4 shows the visible color differences between adjacent LED chip subarrays.

In the mass transfer method described above, the LED chip subarrays are grabbed from different regions of the wafer. However, the color and light intensity distribution among the LED chips within the same wafer is uneven; for example, FIG. 2 shows exemplary distribution patterns of the central wavelength of the emitting light of the LED chips in a wafer. It is clear from FIG. 2 that the central wavelength of the emitting light of the LED chips grabbed from different positions (e.g. from the edge and from the center of the wafer) of the wafer may be different. Thus, color differences occur between the LED chips within a single LED chip subarray, as shown in FIG. 3. In addition, the LED chip subarrays grabbed from different parts of the wafer may show discontinuous and abrupt variations between adjacent subarrays, resulting in visible color differences between adjacent LED chip subarrays, as shown in FIG. 4.

Thus, there is a need for a method to mitigate the mura effect in high-resolution display devices. There is also a need for a device for implementing such a method to achieve better display performance.

BRIEF SUMMARY OF THE INVENTION

An embodiment of the present invention provides a light-emitting diode (LED) display device, including a substrate, a de-mura region, a plurality of mounting blocks, a first LED chip array and a second LED chip array. The substrate includes a first region and a second region, the first region and the second region being adjacent to each other. The de-mura region includes a first part of the first region and a second part of the second region. The mounting blocks are arranged in the first region and the second region as an array, each of the mounting blocks including a first mounting part and second mounting part, the first mounting part and the second mounting part being connected in parallel. The first LED chip array includes a plurality of first LED chips. The second LED chip array includes a plurality of second LED chips. Each of the first mounting parts is arranged on the first side of the corresponding mounting block, and each of the second mounting parts is arranged on the second side of the corresponding mounting block.

Another embodiment of the present invention provides a light-emitting diode (LED) display device, wherein the first LED chips are arranged in the first mounting parts of the mounting blocks within the first region and the second LED chips are arranged in the second mounting parts of the mounting blocks within the second region. Each of the first mounting parts of the mounting blocks within the de-mura region is equipped with a respective first LED chip; and each of the second mounting parts of the mounting blocks within the de-mura region is equipped with a respective second LED chip.

Another embodiment of the present invention provides a light-emitting diode (LED) display device, wherein the first LED chips are arranged in the first mounting parts of the mounting blocks within the first region and the second LED chips are arranged in the first mounting parts of the mounting blocks within the second region. Each of the second mounting parts of the mounting blocks within the intersection of the first region and the de-mura region is equipped with a respective second LED chip; and each of the second mounting parts of the mounting blocks within the intersection of second region and the de-mura region is equipped with a respective first LED chip.

Another embodiment of the present invention provides a light-emitting diode (LED) display device, wherein the LED display device further includes a third LED chip array, including a plurality of second LED chips arranged on the mounting blocks in the first region; and a fourth LED chip array, including a plurality of first LED chips arranged on the mounting blocks in the second region; and wherein the LED display device further comprises a plurality of controllers, arranged in each of the mounting blocks on the substrate, controlling turning-on and turning-off states of the first and second LED chips in the de-mura region.

Another embodiment of the present invention provides a method of manufacturing a light-emitting diode (LED) display device. The method includes: arranging a plurality of mounting blocks as an array on a substrate, each of the mounting blocks including a first mounting part and a second mounting part, the first mounting part being connected in parallel with the second mounting part; transferring a first LED chip array into a first region of the substrate, the first LED chip array including a plurality of first LED chips; and transferring a second LED chip array into a second region of the substrate, the second LED chip array including a plurality of second LED chips. The first region and the second region are adjacent to each other; the first mounting part is arranged on the first side of the corresponding mounting block, and the second mounting part is arranged on the second side of the corresponding mounting block.

Another embodiment of the present invention provides a method of manufacturing a light-emitting diode (LED) display device, wherein the method further includes that each of the first LED chips is arranged in the first mounting part of a respective mounting block within the first region, and each of the second LED chips is arranged in the second mounting part of a respective mounting block within the second region. Each of the first mounting parts of the mounting blocks within the de-mura region is equipped with a respective first LED chip; and each of the second mounting parts of the mounting blocks within the de-mura region is equipped with a respective second LED chip.

Another embodiment of the present invention provides a method of manufacturing a light-emitting diode (LED) display device, wherein the method further includes that each of the first LED chips is arranged in the first mounting part of a respective mounting block within the first region, and each of the second LED chips is arranged in the first mounting part of a respective mounting block within the second region. Each of the second mounting parts of the mounting blocks within the intersection of the first region and the de-mura region is equipped with a respective second LED chip; and each of the second mounting parts of the mounting blocks within the intersection of second region and the de-mura region is equipped with a respective first LED chip.

Another embodiment of the present invention provides a method of manufacturing a light-emitting diode (LED) display device, wherein the method further includes arranging a third LED chip array, including a plurality of second LED chips arranged on the mounting blocks in the first region; and arranging a fourth LED chip array, including a plurality of first LED chips arranged on the mounting blocks in the second region; and wherein the LED display device further comprises a plurality of controllers, arranged in each of the mounting blocks on the substrate, controlling the turning-on and turning-off states of the first and second LED chips in the de-mura region.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present invention can be better understood by reading the subsequent detailed description and examples with references to the accompanying drawings, wherein.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE INVENTION

The following description is made for the purpose of illustrating the general principles of the invention and should not be taken in a limiting sense. The scope of the invention is best determined by reference to the appended claims.

An embodiment of the present invention provides a method of mitigating the mura effect that occurs at the edge of adjacent subarrays of LED chips through the circuit layout and the partial overlapping of adjacent subarrays.

Figure 5:
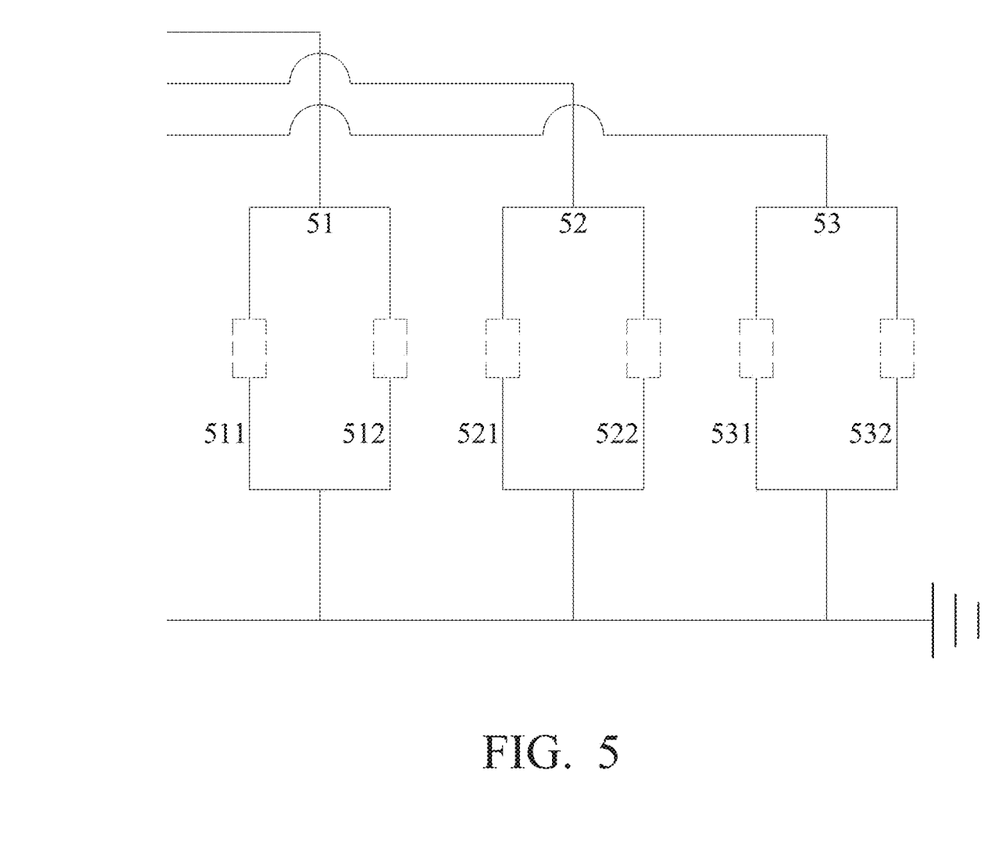
FIG. 5 shows an exemplary circuit layout of each pixel on a substrate.

FIG. 5 shows an exemplary circuit layout of each pixel on a substrate. The substrate may be an element of a display panel, for example. As shown in FIG. 5, a pixel 5 (such as, but not limited to, an RGB pixel) includes three mounting blocks 51, 52 and 53 for mounting red, green and blue LED chips respectively. The mounting block 51 includes two mounting parts 511 and 512 (shown in FIG. 5 as dashed boxes) connected in parallel, the mounting block 52 includes two mounting parts 521 and 522 (shown in FIG. 5 as dashed boxes) connected in parallel, and the mounting block 53 includes two mounting parts 531 and 532 (shown in FIG. 5 as dashed boxes) connected in parallel.

Figure 6:
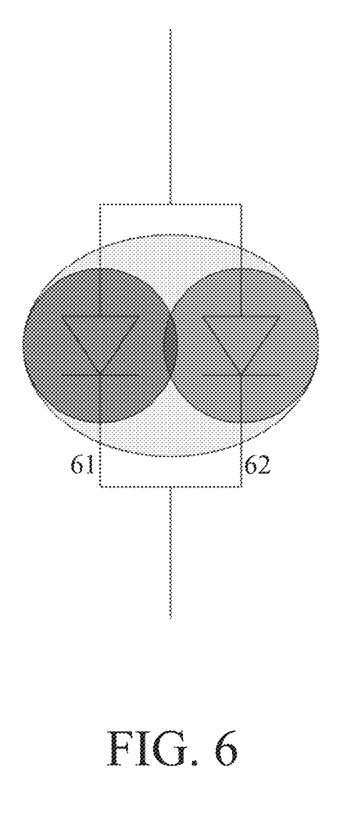
FIG. 6 shows the detailed configuration of the mounting blocks in FIG. 5.

FIG. 6 shows the detailed configuration of the mounting blocks 51, 52 and 53 in FIG. 5. As shown in FIG. 6, a mounting block 6 (e.g. any of the mounting blocks 51, 52 and 53 in FIG. 5) includes two mounting parts 61 and 62 that are close enough (e.g. the distance between the mounting parts 61 and 62 may be, but not limited to, smaller than twice the equivalent diameter of the LED chips) to allow the two LED chips mounted on the same mounting block to mix their color and light intensity sufficiently.

Figure 7A:
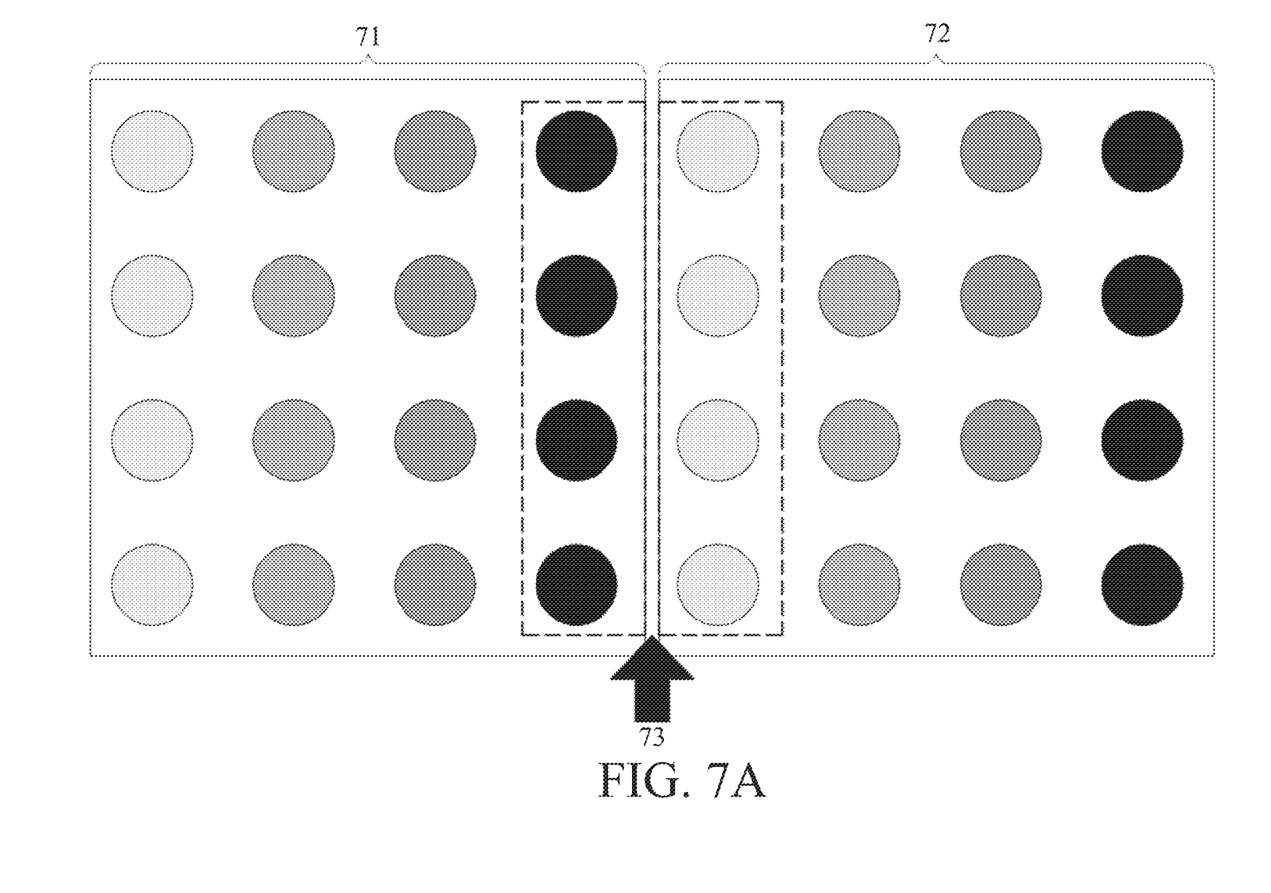
FIGS. 7A and 7B show the partial overlapping of the adjacent subarrays.
Figure 7B:
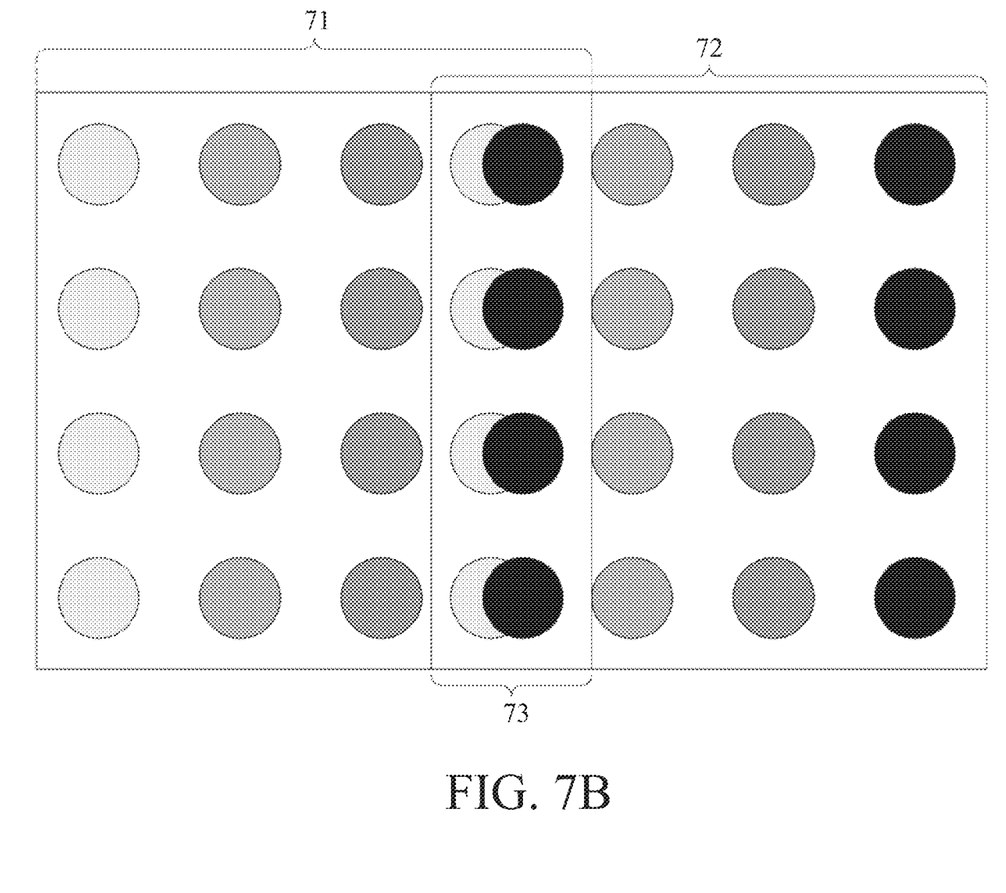

FIGS. 7A and 7B show the partial overlapping of the adjacent subarrays. As shown in FIG. 7A, visible color difference occurs at the edge between two LED chip arrays 71 and 72. To mitigate this defect, the areas of the LED chip arrays 71 and 72 close to the edge are combined and designated as a single de-mura region 73. The size of the de-mura region 73 is discussed below with reference to FIGS. 14A-14D. As shown in FIG. 7B, partial overlapping of the LED chip arrays 71 and 72 within the de-mura region 73 is performed to mitigate the mura effect. The methods of implementing such an overlapping is described below with reference to FIGS. 8-13.

Figure 8:
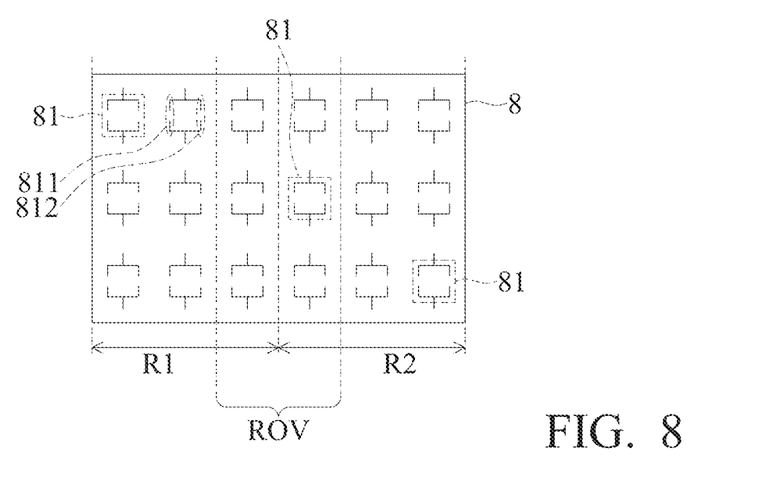
FIGS. 8-13 show exemplary processes of equipping LED chips onto the substrate by mass transfer methods.

FIGS. 8-13 show exemplary processes of equipping LED chips onto the substrate by mass transfer methods. FIG. 8 shows a simplified schematic of the original circuit layout of the substrate 8 before the mass transfer processes. For clarity, FIG. 8 shows the circuit layout for single color LED chips, but persons skilled in the art may readily understand that similar structures may apply to display devices with multiple colors. In FIG. 8, a substrate 8 is provided. The substrate 8 may be, but not limited to, a glass substrate, a printed circuit board (PCB), a soft substrate, a flexible substrate or the like. The substrate 8 includes multiple mounting blocks 81, each including mounting parts 811 and 812. The configuration of each mounting block 81 is similar to any of the mounting blocks 51, 52 and 53 in FIG. 5. That is, mounting parts 811 and 812 are connected in parallel. In the substrate 8, a region R1 will be equipped with LED chips of a first LED chip array in subsequent processes, and a region R2 will be equipped with LED chips of a second LED chip array in subsequent processes. The de-mura region ROV includes part of the region R1 and part of the region R2.

Figure 9:
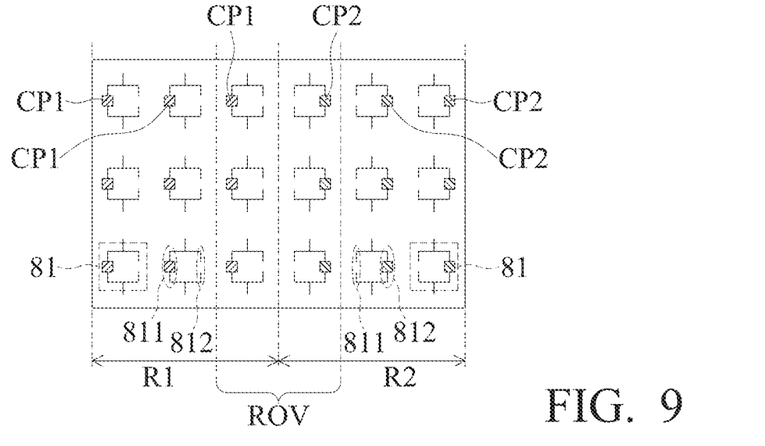
Figure 10:
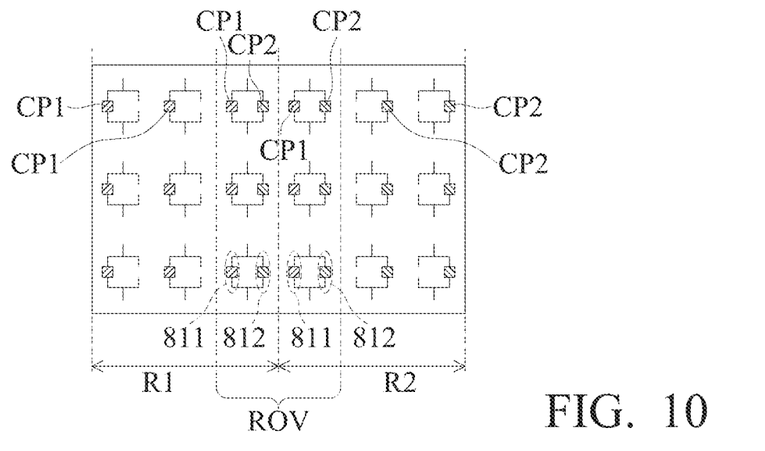

FIGS. 9 and 10 show an exemplary process of equipping LED chips onto the substrate 8. Referring to FIG. 9, the LED chips CP1 of the first LED chip array are equipped in region R1, and the LED chips CP2 of the second LED chip array are equipped in region R2. As shown in FIG. 9, each LED chip CP1 is equipped at one side (e.g. the left side, or the mounting part 811) of its corresponding mounting block 81, while each LED chip CP2 is equipped on another side (e.g. the right side, or the mounting part 812) of its corresponding mounting block 81. Thus, the LED chips within the de-mura region ROV form a symmetric structure.

Referring to FIG. 10, the color difference between the LED chips CP1 and CP2 may cause visible mura effect. To mitigate that, additional LED chips are added into the de-mura region ROV. Each LED chip CP1 within de-mura region ROV requires a corresponding LED chip CP2, and vice versa, to mix these two types of light sufficiently. Thus, each mounting block equipped with a LED chip CP1 within de-mura region ROV is equipped with a LED chip CP2 at the other mounting part (e.g. the mounting part 812), and each mounting block equipped with a LED chip CP2 within the de-mura region ROV is equipped with a LED chip CP1 at the other mounting part (e.g. the mounting part 811), as shown in FIG. 10.

Figure 11:
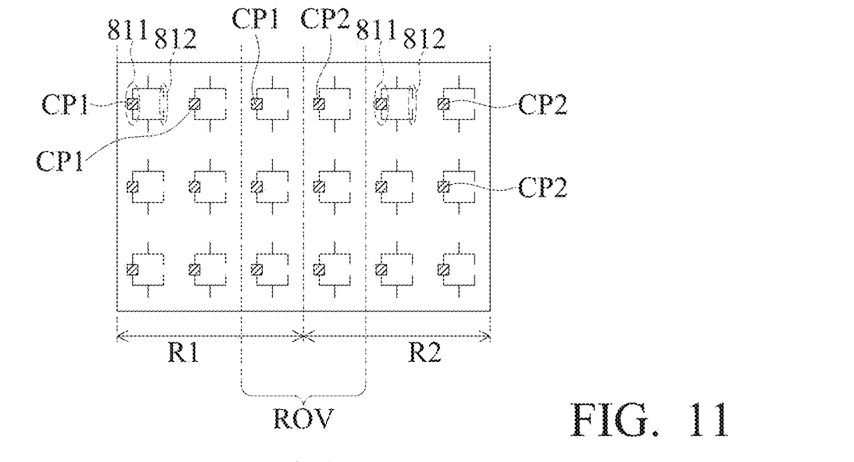
Figure 12:
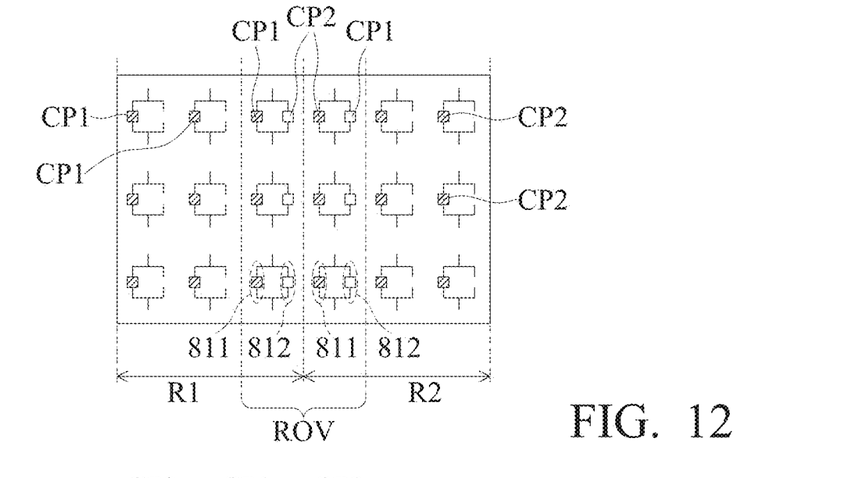

FIGS. 11 and 12 show another exemplary process of equipping LED chips onto the substrate. In this example, the LED chips CP1 of the first LED chip array are equipped in region R1, and the LED chips CP2 of the second LED chip array are equipped in region R2. However, the LED chips CP1 and CP2 are not equipped on opposite sides (i.e. the mounting parts 811 and 812) of the mounting blocks. Rather, they are all equipped on the same side (e.g. the left side, or the mounting part 811) of mounting blocks, as shown in FIG. 11.

Referring to FIG. 12, to mitigate the mura effect that may occur in FIG. 11, each LED chip CP1 within de-mura region ROV requires a corresponding LED chip CP2, and vice versa, to mix these two types of light sufficiently. Thus, each mounting block equipped with a LED chip CP1 within de-mura region ROV is equipped with a LED chip CP2 at the other mounting part (e.g. the mounting part 812), and each mounting block equipped with a LED chip CP2 within the de-mura region ROV is equipped with a LED chip CP1 at the other mounting part (e.g. the mounting part 812), as shown in FIG. 12.

Figure 13:
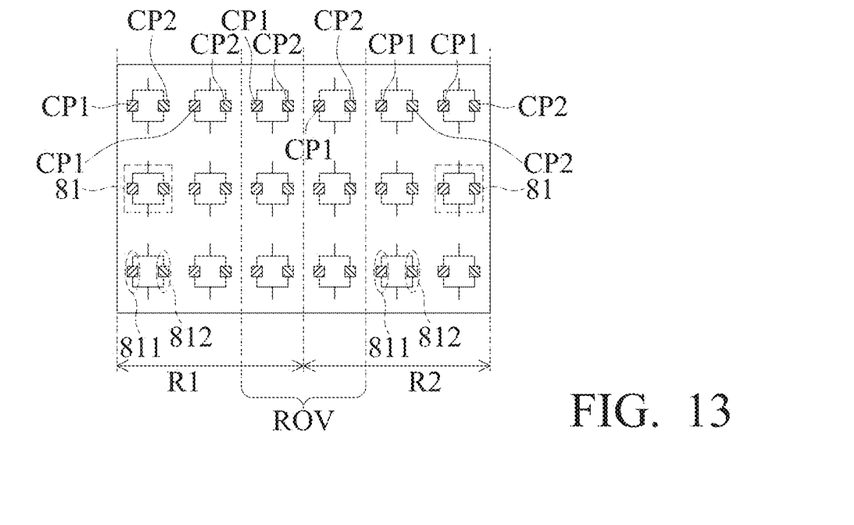

FIG. 13 shows yet another exemplary process of equipping LED chips onto the substrate. In this example, all the LED chips CP1 and CP2 are equipped onto the substrate at once. In FIG. 13, all the mounting blocks 81 in regions R1 and R2 (including the de-mura region ROV) are equipped with both LED chips CP1 and CP2. That is, each mounting part 811 is equipped with a LED chips CP1, and each mounting part 812 is equipped with a LED chips CP2. The mura effect occurring in the de-mura region ROV and regions R1 and R2 may be mitigated through adding LED controllers to the pixels, which is discussed below.

The display performance of the configuration shown in FIGS. 10, 12 and 13 may be enhanced by adding LED controllers to the pixels within the de-mura region ROV. Each of the mounting blocks in FIGS. 10, 12 and 13 may be equipped with a controller (not shown in FIGS. 10, 12 and 13) configured to control the turning-on and turning-off states of the first and second LED chips CP1 and CP2 in the de-mura region and a current flowing through the corresponding first LED chip CP1 and the corresponding second LED chip CP2. The controllers may be arranged on either the front side or the back side of the substrate.

The first LED chips CP1 have a first light-emitting wavelength $\lambda 1$, and the second LED chips CP2 have a second light-emitting wavelength $\lambda 2$. It is noted that the display devices shown in FIGS. 10, 12 and 13 may suffer from both the mura effect at the de-mura region ROV and the color difference between regions R1 and R2. To mitigate the color difference between regions R1 and R2, the controller of each pixel is configured to control a pulse amplitude and a pulse width of the current, such that both of the first light-emitting wavelength $\lambda 1$ and the second light-emitting wavelength $\lambda 2$ may be within a target wavelength range. For example, for green light LEDs, the first light-emitting wavelength $\lambda 1$ may be 535 nm, and the second light-emitting wavelength $\lambda 2$ may be 537 nm.

An embodiment having the LED arrangement as illustrated in FIG. 10 may include a controller equipped in each of the mounting blocks within the de-mura region ROV. The controllers control the turning-on and turning-off states of the first LED chips CP1 and the second LED chips CP2, allowing the mixture of the light emitted from the first LED chips CP1 (with the first light-emitting wavelength $\lambda 1$) and the light emitted from the second LED chips CP2 (with the second light-emitting wavelength $\lambda 2$), leading to the mitigation of the mura effect occurring within the de-mura region ROV.

Another embodiment having the LED arrangement as illustrated in FIG. 10 may include a controller equipped in each of the mounting blocks on the substrate. In this embodiment, the controllers control the turning-on and turning-off states of the first LED chips CP1 and the second LED chips CP2, and the mura effect occurs at the de-mura region ROV is mitigated through the closeness of the first LED chips CP1 and the second LED chips CP2, as shown in FIG. 6. That is, when the first LED chips CP1 and the second LED chips CP2 within the de-mura region ROV are lit up, the closeness of the first LED chips CP1 and the second LED chips CP2 leads to the mixture of the light emitted from the first LED chips CP1 (with the first light-emitting wavelength $\lambda 1$) and the light emitted from the second LED chips CP2 (with the second light-emitting wavelength $\lambda 2$), wherein the first light-emitting wavelength $\lambda 1$ and the second light-emitting wavelength $\lambda 2$ are modulated to be within a target wavelength range by the controllers equipped on the mounting blocks.

An embodiment having the LED arrangement as illustrated in FIG. 12 may include a controller equipped in each of the mounting blocks within the de-mura region ROV. The controllers control the turning-on and turning-off states of the first LED chips CP1 and the second LED chips CP2, allowing the mixture of the light emitted from the first LED chips CP1 (with the first light-emitting wavelength $\lambda 1$) and the light emitted from the second LED chips CP2 (with the second light-emitting wavelength $\lambda 2$), leading to the mitigation of the mura effect occurring within the de-mura region ROV.

Another embodiment having the LED arrangement as illustrated in FIG. 12 may include a controller equipped in each of the mounting blocks on the substrate. In this embodiment, the controllers control the turning-on and turning-off states of the first LED chips CP1 and the second LED chips CP2, and the mura effect occurs at the de-mura region ROV is mitigated through the closeness of the first LED chips CP1 and the second LED chips CP2, as shown in FIG. 6. That is, when the first LED chips CP1 and the second LED chips CP2 within the de-mura region ROV are lit up, the closeness of the first LED chips CP1 and the second LED chips CP2 leads to the mixture of the light emitted from the first LED chips CP1 (with the first light-emitting wavelength $\lambda 1$) and the light emitted from the second LED chips CP2 (with the second light-emitting wavelength $\lambda 2$), wherein the first light-emitting wavelength $\lambda 1$ and the second light-emitting wavelength $\lambda 2$ are modulated to be within a target wavelength range by the controllers equipped on the mounting blocks.

In FIG. 13, each mounting block in the substrate is equipped with a first LED chip CP1, a second LED chip CP2 and a controller. In the region R1, the first LED chips CP1 are lit up. In the region R2, the second LED chips CP2 are lit up. The first light-emitting wavelength $\lambda 1$ of the first LED chips CP1 and the second light-emitting wavelength $\lambda 2$ of the second LED chips CP2 are modulated to be within a target wavelength range to mitigate the color difference between regions R1 and R2, as mentioned above. To mitigate the mura effect occurring at the de-mura region ROV, both the first LED chips CP1 and the second LED chips CP2 within the de-mura region ROV are lit up. The closeness of the first LED chips CP1 and the second LED chips CP2 thus mitigates the mura effect occurring at the de-mura region ROV.

In FIG. 13, the method of mitigating the mura effect occurred within the de-mura region ROV may also apply to a trouble region suffering from the mura effect within the regions R1 and R2. That is, when the trouble region is detected within the region R1 or R2, both of the corresponding first LED chips CP1 and the second LED chips CP2 in the trouble region are lit up by the controllers. The closeness of the first LED chips CP1 and the second LED chips CP2 thus mitigates the mura effect occurring at the region R1 or R2.

Figure 14A:
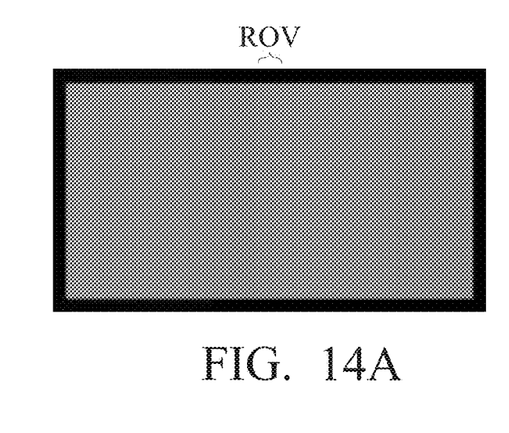
FIGS. 14A-14D show different exemplary areas of the de-mura region.
Figure 14B:
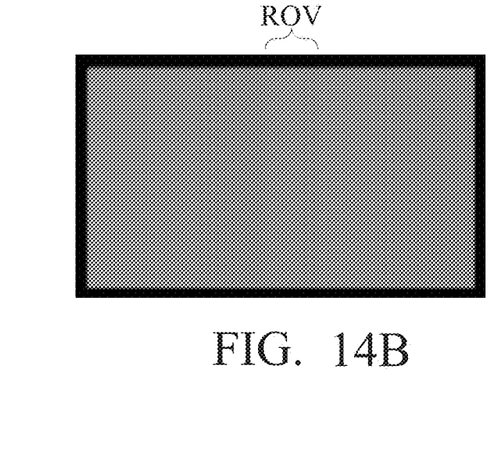
Figure 14C:
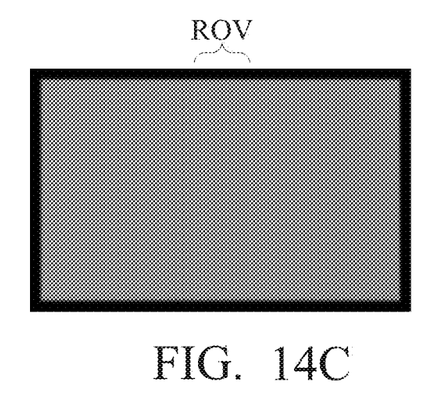
Figure 14D:
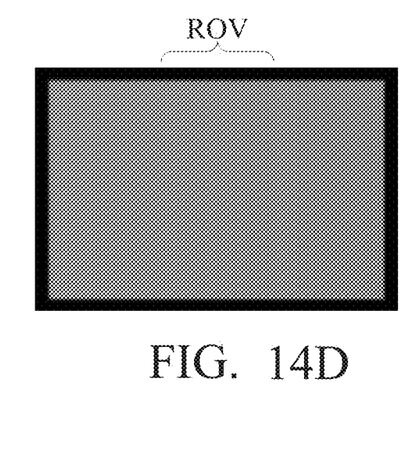

The area of the de-mura region may be selected to fit in with practical needs. FIGS. 14A-14D shows four different exemplary areas of the de-mura region. The size of the de-mura region in FIG. 14A is 12.5% of the area of the first region or the second region, 25% for FIG. 14B, 37.5% for FIG. 14C, and 50% for FIG. 14D. The manufacturer may select a suitable overlapping percentage to make a trade-off between cost and performance. As shown in FIGS. 14A-14D, as the size of the de-mura region ROV increases, the color difference between the two opposite sides of the de-mura region ROV mitigates.

While the aforementioned figures illustrate two mounting parts (e.g. 811 and 812 in FIG. 8) within each mounting block (e.g. 81 in FIG. 8), the invention is not limited thereof. For example, the manufacturer may add a third mounting part to each mounting block, each of the third mounting parts within the de-mura region is equipped with a third LED chip with a third light-emitting wavelength $\lambda 3$, so as to further mitigate the mura effect that occurs in the de-mura region. For example, for green light LEDs, the third light-emitting wavelength $\lambda 3$ may be 536 nm when the first light-emitting wavelength $\lambda 1$ is 535 nm and the second light-emitting wavelength $\lambda 2$ is 537 nm.

To expand the configurations shown in FIGS. 8-13 to multi-color display devices, manufacturers may repeat the configurations shown in FIGS. 8-13 multiple times (e.g. three times for RGB display devices) to make each pixel similar to the configuration shown in FIG. 5. That is, each of the region R1 and the region R2 comprises a plurality of pixels, each of the pixels comprises a first mounting block, a second mounting block and a third mounting block. Each of the first mounting blocks, the second mounting blocks and the third mounting blocks includes a first mounting part and a second mounting part. Each of the first mounting parts of the first mounting blocks is equipped with a first LED chip with a first light-emitting wavelength (e.g. red light), and each of the second mounting parts of the first mounting blocks is equipped with a second LED chip with a second light-emitting wavelength (e.g. red light with a slightly different wavelength), the first light-emitting wavelength being close to the second light-emitting wavelength. Each of the first mounting parts of the second mounting blocks is equipped with a third LED chip with a third light-emitting wavelength (e.g. green light), and each of the second mounting parts of the second mounting blocks is equipped with a fourth LED chip with a fourth light-emitting wavelength (e.g. green light with a slightly different wavelength), the third light-emitting wavelength being close to the fourth light-emitting wavelength. Each of the first mounting parts of the third mounting blocks is equipped with a fifth LED chip with a fifth light-emitting wavelength (e.g. blue light), and each of the second mounting parts of the third mounting blocks is equipped with a sixth LED chip with a sixth light-emitting wavelength (e.g. blue light with a slightly different wavelength), the fifth light-emitting wavelength being close to the sixth light-emitting wavelength.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode (LED) display device, comprising:
    a substrate, including a first region and a second region, the first region and the second region being adjacent to each other;
    a de-mura region partially overlapped the first region and partially overlapped the second region, including a first part of the first region and a second part of the second region;
    a plurality of first LED chips arranged in the first region and the second part of the second region; and
    a plurality of second LED chips arranged in the second region and the first part of the first region.

2. The LED display device as claimed in claim 1, wherein the first LED chips have a first light-emitting wavelength, the second LED chips have a second light-emitting wavelength, and the first light-emitting wavelength is different from the second light-emitting wavelength.

3. The LED display device as claimed in claim 1, wherein the area of the de-mura region is 12.5%, 25%, 37.5% or 50% of the area of the first region or the second region.

4. The LED display device as claimed in claim 1, further including a plurality of mounting blocks arranged in the first region and the second region, each of the mounting blocks including a first mounting part and a second mounting part, wherein each of the first mounting parts is arranged on a first side of the corresponding mounting block, and each of the second mounting parts is arranged on a second side of the corresponding mounting block.

5. The LED display device as claimed in claim 4, wherein the first LED chips are arranged in the first mounting parts of the mounting blocks within the first region and the second LED chips are arranged in the second mounting parts of the mounting blocks within the second region.

6. The LED display device as claimed in claim 4, wherein the first LED chips are arranged in the first mounting parts of the mounting blocks within the first region and the second LED chips are arranged in the first mounting parts of the mounting blocks within the second region.

7. The LED display device as claimed in claim 5, wherein:
   each of the first mounting parts within the second part of the second region is equipped with one of the first LED chips; and
   each of the second mounting parts within the first part of the first region is equipped with one of the second LED chips.

8. The LED display device as claimed in claim 6, wherein:
   each of the second mounting parts within the first part of the first region is equipped with one of the second LED chips; and
   each of the second mounting parts within the second part of the second region is equipped with one of the first LED chips.

9. The LED display device as claimed in claim 4, wherein the distance between the first mounting part and the second mounting part is smaller than twice the equivalent diameter of the first LED chips and the second LED chips.

10. The LED display device as claimed in claim 7, further comprising a plurality of controllers, wherein each of the plurality of controllers is arranged in each of the mounting blocks within the overlapped part of the first region and the second region to control turning-on and turning-off states of the first and the second LED chips in the de-mura region.

11. The LED display device as claimed in claim 10, wherein each of the controller is configured to control a current flowing through the corresponding first LED chip and the corresponding second LED chip.

12. The LED display device as claimed in claim 11, wherein the controllers are arranged on a front side of the substrate.

13. The LED display device as claimed in claim 11, wherein the controllers are arranged on a back side of the substrate.

14. The LED display device as claimed in claim 11, wherein:
   the first LED chips have the first light-emitting wavelength;
   the second LED chips have the second light-emitting wavelength; and
   the controller is configured to control a pulse amplitude and a pulse width of the current, such that both of the first light-emitting wavelength and the second light-emitting wavelength are within a target wavelength range.

15. The LED display device as claimed in claim 1, wherein the substrate comprises a printed circuit board (PCB), a glass substrate, a soft substrate, or a flexible substrate.

16. The LED display device as claimed in claim 1, wherein the first region and the second region are arranged at the same level on the substrate.

17. The LED display device as claimed in claim 1, wherein the first region excluding the first part is equipped with only first LED chips and devoid of any second LED chips.

18. The LED display device as claimed in claim 1, wherein the second region excluding the second part is equipped with only second LED chips and devoid of any first LED chips.

* * * * *